United States Patent [19]

Dillman

[11] Patent Number: 4,959,608
[45] Date of Patent: Sep. 25, 1990

[54] APPARATUS AND METHOD FOR EXTRACTING THE RMS VALUE FROM A SIGNAL

[75] Inventor: Norman G. Dillman, El Paso, Tex.
[73] Assignee: Hewlett-Packard Company, Palo Alto, Calif.
[21] Appl. No.: 422,335
[22] Filed: Oct. 16, 1989
[51] Int. Cl.$^5$ .................... G01R 15/10; G01R 19/22
[52] U.S. Cl. .................... 324/132; 324/119; 324/99 D
[58] Field of Search .............. 324/114, 132, 107, 119, 324/99 D; 307/261; 328/13, 14; 364/851, 718

[56] References Cited

U.S. PATENT DOCUMENTS

| | | | |
|---|---|---|---|
| 3,020,479 | 2/1962 | Logan | 328/13 |
| 3,942,095 | 3/1976 | Togreri et al. | 324/119 |
| 4,001,697 | 1/1977 | Withers et al. | 307/261 |
| 4,599,567 | 7/1986 | Goupillaud et al. | 328/14 |
| 4,786,859 | 11/1988 | Arseneau et al. | 324/132 |

OTHER PUBLICATIONS

Hayes; "Root Mean Square Digital Panel Meter . . . ", Analog Dialogue; Sep. 2, 1975; pp. 6–7.

Primary Examiner—Reinhard J. Eisenzopf
Assistant Examiner—Vinh P. Nguyen

[57] ABSTRACT

Disclosed is apparatus and method for converting and displaying the total RMS and AC RMS values of a signal in a voltmeter. This conversion is accomplished in a system having a processor and a plurality of signal conversion stages. The first signal conversion stage comprises a low-pass filter to extract the DC component of the input signal followed by an analog-to-digital converter to convert the DC component into a digital value. The remaining signal conversion stages convert the AC component of the input signal to a series of smaller and smaller DC average values. Typically there are five of these AC conversion stages, each comprising a high-pass filter connected to a full-wave rectifier which is in turn connected to a low-pass filter followed by an analog-to-digital converter. The first AC stage high-pass filter is connected to the input signal and subsequent AC stage high-pass filters are connected to the output of the full-wave rectifier of the previous AC conversion stage. A processor inputs all the digital values from the various conversion stages, squares each of the values, and computes the sum of these squares. The processor then computes the square root of this sum to provide the RMS or AC RMS value. If the DC component digital value is used in the computation the result is the total RMS voltage of the input, but if the DC component is excluded, the result is the AC RMS value. The processor then displays either the total RMS or the AC RMS value on the display of the voltmeter.

11 Claims, 7 Drawing Sheets

APPARATUS AND METHOD FOR EXTRACTING THE RMS VALUE FROM A SIGNAL

BACKGROUND OF THE INVENTION

This invention relates to electronic measurement instruments and more particularly to apparatus and methods for calculating voltage or current in such instruments. Even more particularly, the invention relates to apparatus and methods for calculating RMS current and voltage signals using a plurality of filtration, rectification, and processing stages.

In order for a digital voltmeter to measure and display the correct RMS (Root-Means-Square) value of a signal, the signal needs to be converted from its AC form into a form suitable for a digital display. Three prior art methods have been used to accomplish RMS conversion, and none of the three methods can be used conveniently with CMOS (Complimentary-Metal-Oxide-Semiconductor) implementations, where the entire system is implemented in CMOS. The first method is thermal conversion which accomplishes the RMS conversion by passing the input signal to a device which is heated by the power in the signal, and since the temperature change will be directly proportional to the power or mean-square of the signal, this temperature change can be converted into the RMS voltage. This method usually involves using a matched heater pair which is part of a feedback system wherein the signal being tested is connected to one of the heaters and an instrument-generated DC signal is connected to the other heater. The system derives its error signal from the temperature difference of the two heaters. The DC signal required to null the temperature difference is equal to the RMS value of the unknown signal. In addition, in this type of system, the DC voltage must be converted to a digital signal with an analog-to-digital converter. Since CMOS integrated circuits cannot measure temperature change directly, many external components are needed to accomplish the thermal conversion method.

Another method used for the RMS conversion in prior art devices is to have a bipolar integrated circuit perform an analog squaring, averaging, and square root conversion. Since CMOS integrated circuits are more suited to digital functions, the analog squaring and square root converters cannot be placed in them, thus this method is not suitable for use with CMOS circuits.

A third method used in prior art devices for RMS conversion is the use of sampling techniques wherein the input signal is sampled at various times and the average of these sample values is computed. This would be a more complicated system involving some very high performance circuits which would not be suited to a modest performance, very low cost instrument.

It is thus apparent that there is a need in the art for an improved apparatus and method which will extract the RMS value from an unknown input signal. There is a further need for such apparatus and method that extracts such RMS value in such a way that it can be implemented in a CMOS process. There is a still further need in the art for such apparatus and method that is suited for a modest performance, very low cost instrument that could have other functions such as display control on the same CMOS chip.

SUMMARY OF THE INVENTION

It is an object of the present invention to provide a system for extracting the RMS value of an unknown signal.

It is another object of the invention to provide such a system that can be implemented in a CMOS process along with other functions.

It is still another object of the invention to provide such a system that extracts a result using a series of very simple filtration and rectification stages, each of which has an output connected to a processor for computing the result.

The above and other objects are accomplished in a system having a processor and a plurality of signal conversion stages. The first signal conversion stage comprises a low-pass filter to extract the DC component of the input signal followed by an analog-to-digital converter to convert the DC component into a digital value which is then passed to a processing section. The other signal conversion stages convert the AC component of the input signal to a series of smaller and smaller DC average values. Each remaining conversion stage comprises a high-pass filter connected to a full-wave rectifier which feeds a low-pass filter followed by an analog-to-digital converter to convert the result into a digital value. The first AC stage high-pass filter is connected to the input signal, and subsequent AC stage high-pass filters are connected to the output of the full-wave rectifier of the previous AC conversion stage.

A processing section inputs all the digital values from the various stages, squares these values, sums their squares and computes the square root of this sum to provide the total RMS or AC RMS value. If the input signal DC component digital value is used in the computation, the result is the RMS voltage of the input. If only the input signal AC component digital values are used, the result is the AC RMS value.

BRIEF DESCRIPTION OF THE DRAWINGS The above and other objects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

In general, the invention uses a series of stages each comprising a high-pass filter, a full-wave rectifier, a low-pass filter and an analog-to-digital conversion circuit to convert the AC component of the input signal to a series of smaller and smaller DC average values. The input to each of these successive stages comes from the output of the full-wave rectifier of the previous stage, thus the lowest frequency of the input signal is doubled with each stage. After passing through several of these stages, typically five stages, the signal level has reduced to where it will have no appreciable effect on the output signal. The values created by the analog-to-digital converters of each of these stages are squared, then summed, and the square root is taken of this sum to produce the AC RMS value. For computing the total RMS value, an additional DC stage is connected to the input signal. This stage has only a low-pass filter to remove all the AC component, followed by an analog-to-digital converter to convert the DC component to a value which can then be processed.

Figure 1:
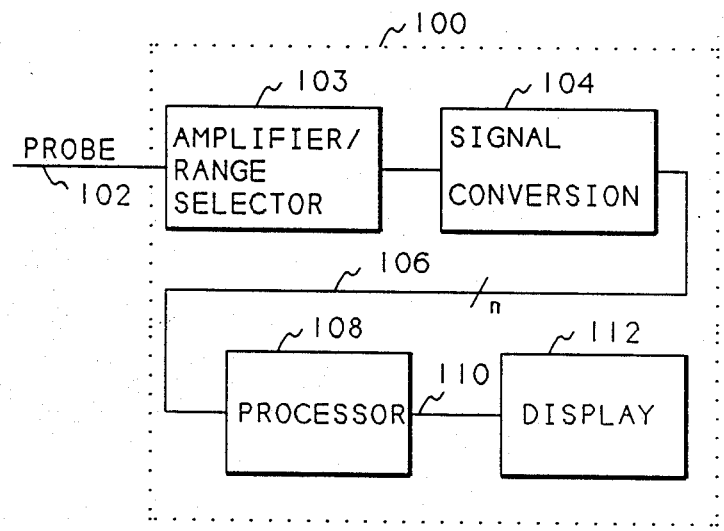
FIG. 1 is a block diagram of the hardware of an instrument that uses the present invention.
Figure 3G:
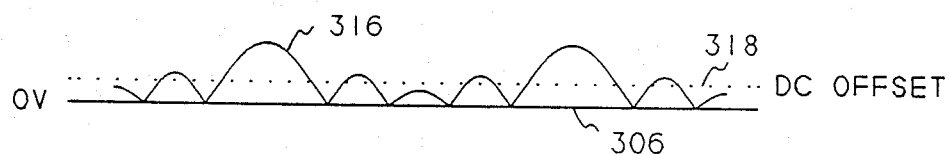
FIGS. 3A through 3G show a series of waveforms that represent the input signal as it passes through various stages of the hardware of the signal conversion section.

FIG. 1 shows a block diagram of the voltmeter of the present invention. Referring now to FIG. 1, a voltmeter 100 is shown having a probe 102 which is used to input a signal to the voltmeter. An amplifier/range selector 103 buffers the input signal and selects the proper range for display. The amplified or attenuated signal then feeds into a signal conversion section 104 where the signal is converted to a plurality of digital values 106. These digital values are passed to a processing section 108 which squares each of the values, sums these squares, and takes the square root to produce a digital RMS value 110. This digital RMS value 110 is passed to a display section 112 which displays the value for the user of the voltmeter.

Figure 2:
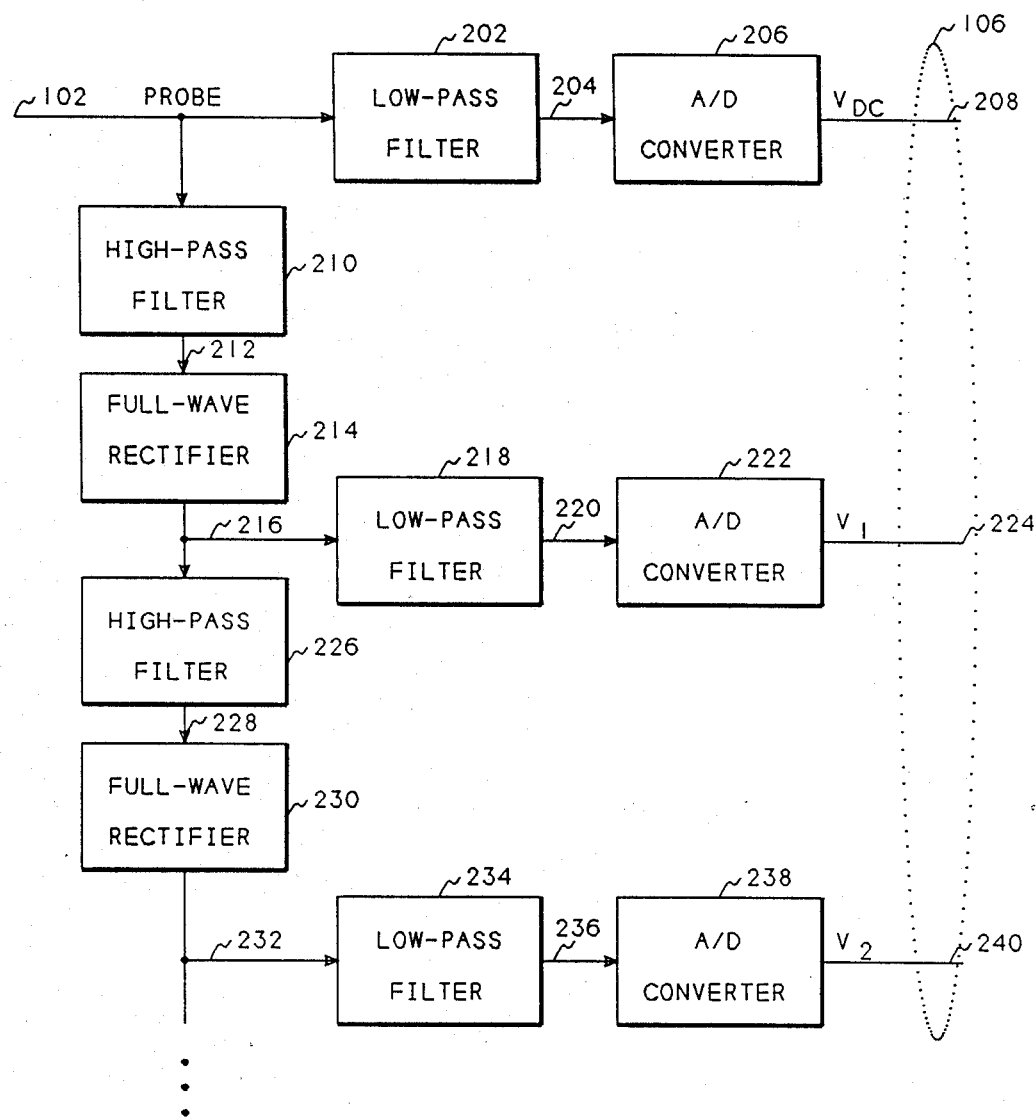
FIG. 2 is a block diagram of the filtration and rectification stages of the signal conversion section of FIG. 1.

FIG. 2 is a block diagram of the signal conversion section 104 of FIG. 1. Referring now to FIG. 2, the input signal enters the signal conversion section through the probe 102. For simplification, the amplifier/range selector has been left out of this figure. The input signal is then fed to a low-pass filter 202 which removes the AC component from the signal. The remaining DC component 204 is then sent to an analog-to-digital converter stage 206 which converts the DC component into a digital value $V_{DC}$. The $V_{DC}$ signal 208 is then passed on to the processing section as a part of the signal 106. The filter stage 202 and analog-to-digital conversion stage 206 can be combined into a single CMOS circuit, if desired.

The input signal available on the probe 102 is also passed to a high-pass filter 210, in the first AC conversion stage, which removes the DC component of the signal and passes only the AC component through signal 212 to a full-wave rectifier 214. The full-wave rectifier 214 converts the AC signal 212 into a DC composite signal 216 (having an AC component and a DC average value) and passes that signal to a low-pass filter 218 which removes the AC component of the signal 216 and passes only the DC average value 220 to an analog-to-digital converter stage 222. The A/D converter stage 222 converts the DC average value 220 into a digital value 224 and passes that digital value through the signal 106 to the next section. The output 216 of the full-wave rectifier 214 is sent to a high-pass filter 226 in the next AC conversion stage. Because of the effect of the full-wave rectifier 214 in the previous stage, the frequency of the signal 216 is twice the frequency of the original input signal at the probe 102. The highpass filter 226 removes the DC component from the signal 216 and passes only the AC signal 228 to the next full-wave rectifier 230. The full-wave rectifier 230 converts the AC signal 228 into a DC composite signal 232 and passes this DC signal to a low-pass filter 234. The low-pass filter 234 removes the AC component from the signal 232 and passes only the DC component 236 to an analog-to-digital converter 238. The A/D converter 238 converts the DC component 236 into a digital value 240 and passes this digital value to the processing section through signal 106.

The high-pass filter 210 and full wave rectifier 214 can be combined into a single CMOS circuit, if desired.

There are additional AC conversion stages connected in series to the previous stages, typically three more for a total of five, to extract more information regarding the AC component of the original signal and send this information to the processing section.

Figure 3A:
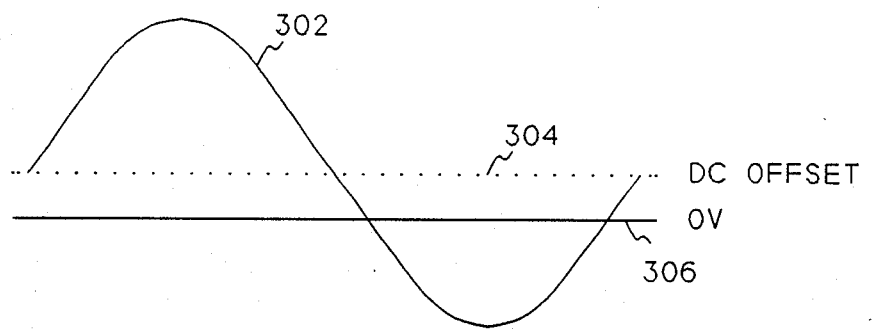

The operation of the signal conversion section 104 can best be illustrated by referring to timing diagrams of the signals at various points in the operation of the signal conversion stage 104. These diagrams are shown in FIGS. 3A through 3G. FIG. 3A shows a typical input signal that would appear on the probe 102. The signal has a sinusoidal wave form for simplicity 302 which is not symmetrical about the zero voltage point 306, but instead has a DC offset value 304. After passing through the low-pass filter 202 (FIG. 2) the AC component 302 will be removed from the signal leaving only the DC offset value 304 which passes through the A/D converter 206 and is converted to a digital value 208.

Figure 3B:
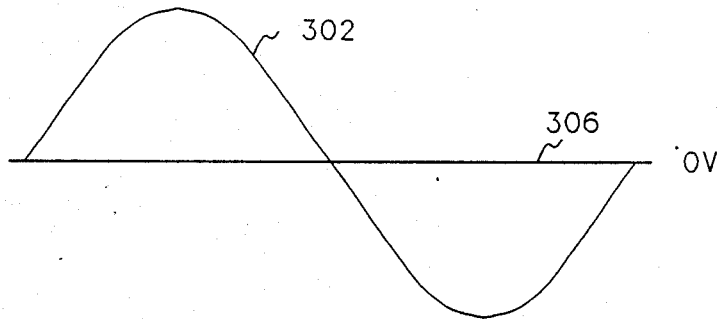
Figure 3C:
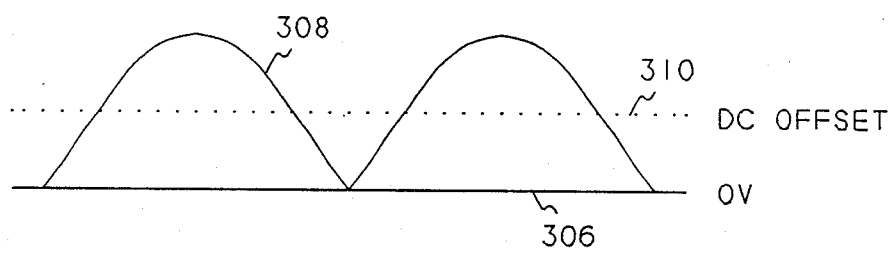

The signal shown in FIG. 3A also goes to the high-pass filter 210 which removes the DC offset 304 leaving only the sinusoidal wave form 302. The result of the signal of FIG. 3A passing through the high-pass filter 210 is shown in FIG. 3B which represents the output 212 of the high-pass filter 210. As shown in FIG. 3B, only the sinusoidal wave form 302 remains in the original signal from FIG. 3A. The DC offset 304 in the original signal of FIG. 3A has been removed and now the sinusoidal wave form 302 is symmetrical about the zero voltage point 306. The signal of FIG. 3B then passes through the full-wave rectifier 214 and emerges at point 216 as the wave form shown in FIG. 3C. FIG. 3C shows that the original sinusoidal AC wave form 302 has been rectified and converted to a DC wave form 308 which is no longer symmetrical about the zero axis 306, but instead has a new DC offset 310. The signal of FIG. 3C then passes through the low-pass filter 218 which removes the AC component of the signal of FIG. 3C leaving only the DC offset 310 which is passed to the A/D converter 222 to be converted into a digital value 224 and passed on to the next section in signal 106.

Figure 3D:
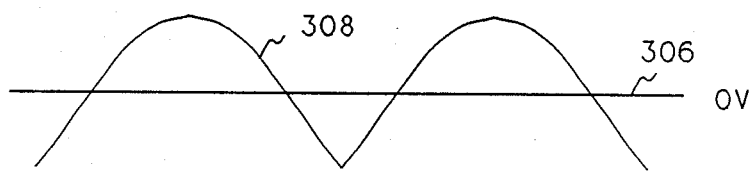
Figure 3E:
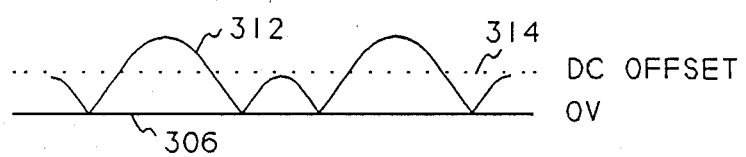

The signal of FIG. 3C is passed to the high-pass filter 226 which removes the DC offset component 310 resulting in the signal shown in FIG. 3D, which is the output 228 of the high-pass filter 226. FIG. 3D shows that the original signal of FIG. 3C has been shifted by the high-pass filter 226 so that the DC offset point 310 of FIG. 3C has been shifted down to the zero voltage point 306 in FIG. 3D. The signal of FIG. 3D is then processed by the full-wave rectifier 230 and the output 232 of the full-wave rectifier 230 is shown in FIG. 3E. The signal of FIG. 3E is then passed through the low-pass filter 234 which removes the AC component of this signal leaving only the DC offset 314. This DC offset is then passed through the A/D converter 238 which converts the DC offset to a digital value 240 and passes it on to the next stage through signal 106.

Figure 3F:
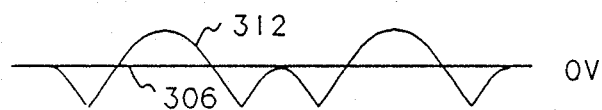

FIG. 3E shows that the full-wave rectifier 230 has doubled the frequency of the AC component 312 from the AC component 308 of FIGS. 3C and 3D. The signal of FIG. 3E then passes through the next AC conversion stage, which is not shown in FIG. 2. As the signal of FIG. 3E passes through the high-pass filter of this next stage, it is converted to the signal of FIG. 3F by removing the DC offset and centering the signal around the zero voltage point 306. The signal of FIG. 3F is then passed through the full-wave rectifier of the stage which results in the signal of FIG. 3G. The signal of FIG. 3G then goes through the low-pass filter of the next stage which removes the AC component 316 leaving only the DC offset 318 which is converted by the A/D converter of that stage into a digital value which is passed to the next stage through signal 106.

As the signal continues through subsequent AC conversion stages, the DC offset gets closer and closer to the zero voltage point. After about five AC conversion stages, the DC offset is no longer significant.

Figure 4:
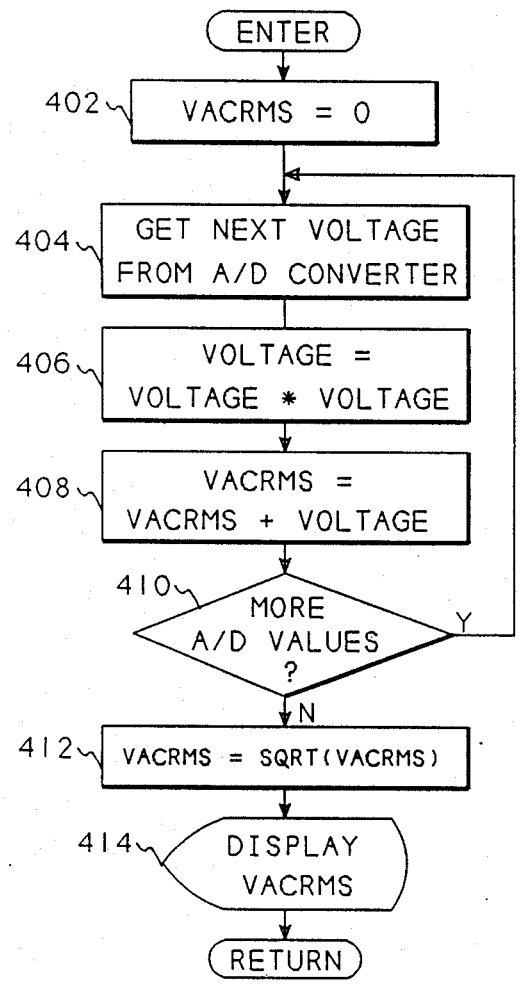
FIG. 4 is a flowchart of the process of calculating the AC voltage of the signal input to the invention.

FIG. 4 is a flow chart of the process of calculating the AC RMS voltage using the digital values output by the A/D converters of the signal conversion stage. The equation for this calculation is:

$$V_{ACRMS} = \sqrt{V_1^2 + V_2^2 + \ldots V_n^2}$$

Referring now to FIG. 4, after entry block 402 sets the VACRMS voltage to zero. Since this flow chart only calculates the AC RMS value, the $V_{DC}$ signal 208 of FIG. 2 is not used. Therefore, block 404 gets the next voltage from the A/D converter, which is voltage $V_1$ 224 shown in FIG. 2. Block 406 computes the square of the value of the voltage and block 408 adds this value to VACRMS to compute a new sum. Block 410 then decides whether there are more A/D values to be retrieved. In a typical signal conversion system there would be five AC stages of conversion, so block 410 would then go back to block 404 four more times. Each time through the loop 404, 406, and 408, a new digital value would be retrieved from one of the A/D converters of one of the AC conversion stages, this new value would be squared and added to the value of VACRMS. After processing all digital values from the AC conversion stages of the signal conversion section, block 410 would then transfer to block 412. Block 412 takes the square root of the VACRMS value and block 414 displays the square root, which is now the AC RMS value, on the display of the voltmeter before exiting.

Figure 5:
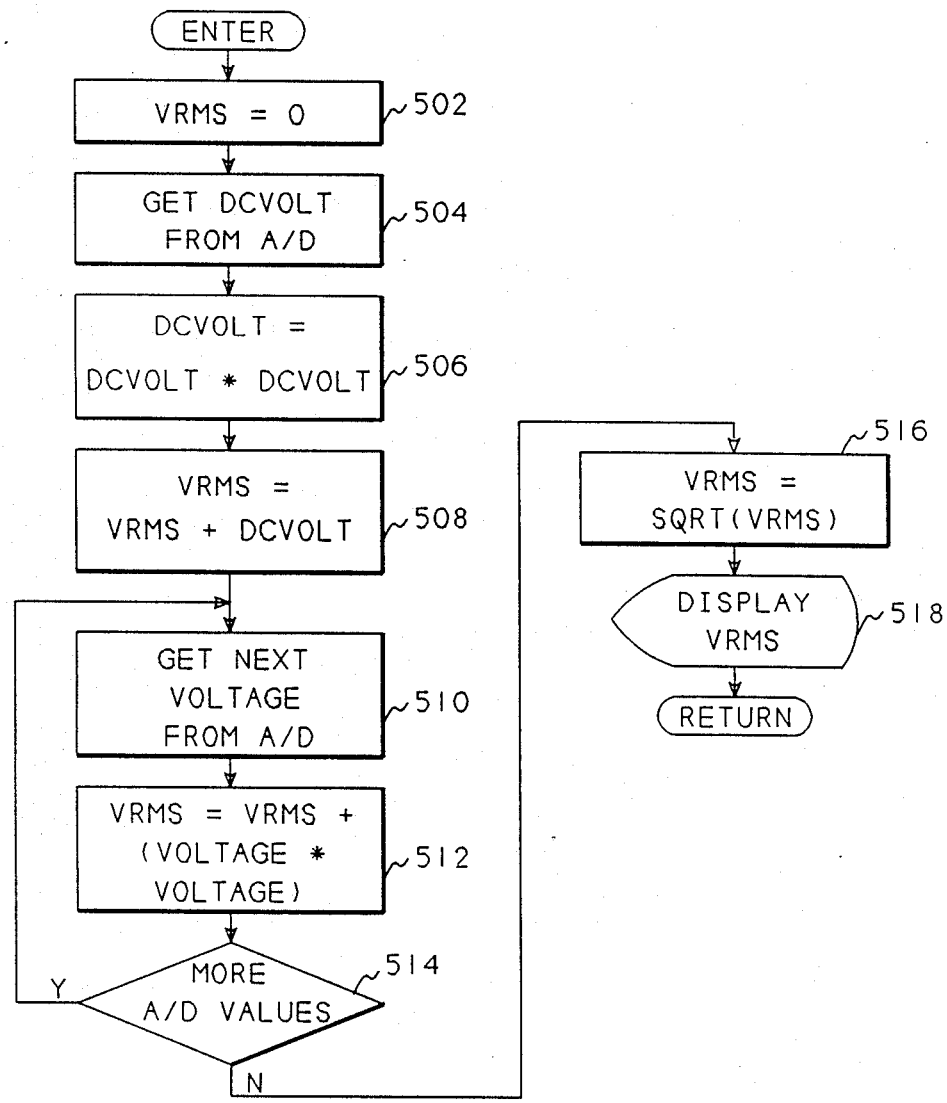
FIG. 5 is a flowchart of the process of calculating the RMS voltage of the signal input to the invention.

FIG. 5 is a flow chart of the process of calculating the RMS voltage of the signal input to the voltmeter. The equation for the Total RMS voltage is :

$$V_{RMS} = \sqrt{V_{DC}^2 + V_1^2 + V_2^2 + \ldots V_n^2}$$

Referring now to FIG. 5, after entry, block 502 sets the VRMS value to zero. Block 504 then gets the DC voltage digital value 208 from the A/D converter 206 shown in FIG. 2, and block 506 computes the square of this DC voltage. Block 508 then adds the square to the VRMS value before going to block 510. Block 510 gets the first AC voltage 224 from the A/D converter 222 of FIG. 2, and block 512 squares the voltage retrieved in block 510 and adds the result to VRMS. Block 514 then determines whether there are more A/D values to be retrieved. Just as in the flow chart of FIG. 4, there will typically be a total of five AC conversion values to be retrieved so block 514 will transfer back in the loop four more times. After all of the AC conversion voltages have been retrieved, squared and added to VRMS, block 514 will transfer to block 516 which computes the square root of VRMS. Block 518 then displays the new VRMS on the display of the voltmeter before exiting.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A measurement instrument for deriving an RMS signal from an input signal comprising:
   DC component conversion means connected to said input signal for producing a digital value equivalent to the DC offset signal of said input signal;
   a plurality of AC conversion stages connected in series for producing an output equivalent to the AC RMS signal, wherein a first of said AC conversion stages has an input connected to said input signal and wherein subsequent stages have an input connected to a previous AC conversion stage;
   a plurality of analog to digital conversion stages, one analog to digital conversion stage connected to said output of each of said AC conversion stages, for converting said output to a digital value; and
   processing means for receiving each said digital value, squaring said digital value, adding said squared values producing a sum of squares, and outputting a square root of said sum of squares.

2. The instrument of claim 1 wherein said DC conversion stage comprises:
   low-pass filter means connected to said input signal; and
   analog-to-digital conversion means connected to an output of said low-pass filter means for outputting a DC digital value equivalent to said output of said low-pass filter means.

3. The instrument of claim 1 wherein each of said AC conversion stages comprises:
   high-pass filter means; and
   full-wave rectifier means having an input connected to an output of said high-pass filter means;
   wherein said high-pass filter means of said first of said AC conversion stages has an input connected to said input signal and wherein each said high-pass filter means of subsequent AC conversion stages has an input connected to an output of said full-wave rectifier of a previous AC conversion stage.

4. The instrument of claim 3 wherein said high-pass filter means and said full-wave rectifier means are combined into a single circuit.

5. The instrument of claim 3 wherein each of said analog to digital conversion stages comprises:
   low-pass filter means having an input connected to an output of said full-wave rectifier means; and
   analog-to-digital conversion means, having an input connected to an output of said low-pass filter means, for outputting an AC digital value equivalent to said output of said low-pass filter means.

6. The instrument of claim 5 wherein said low-pass filter means and said analog-to-digital conversion means are combined into a single circuit.

7. A measurement instrument for deriving an AC RMS voltage from an input signal comprising:
   a plurality of series AC conversion stages connected in series for producing an output equivalent to the AC RMS signal, wherein a first of said AC conversion stages has an input connected to said input signal and wherein subsequent stages have an input connected to a previous AC conversion stage;
   a plurality of analog to digital conversion stagEs, one analog to digital conversion stage connected to said output of each of said AC conversion stages, for converting said output to a digital value; and
   processing means for receiving each said digital value, squaring said digital value, adding said squared values producing a sum of squares, and outputting a square root of said sum of squares.

8. The instrument of claim 3 wherein each of said AC conversion stages comprises:
   high-pass filter means; and
   full-wave rectifier means having an input connected to an output of said high-pass filter means;
   wherein said high-pass filter means of said first of said AC conversion stages has an input connected to said input signal and wherein each said high-pass filter means of subsequent AC conversion stages has an input connected to an output of said full-wave rectifier of a previous AC conversion stage.

9. The instrument of claim 8 wherein said high-pass filter means and said full-wave rectifier means are combined into a single circuit.

10. The instrument of claim 8 wherein each of said analog to digital conversion stages comprises:
    low-pass filter means having an input connected to an output of said full-wave rectifier means; and
    analog-to-digital conversion means, having an input connected to an output of said low-pass filter means, for outputting an AC digital value equivalent to said output of said low-pass filter means.

11. The instrument of claim 10 wherein said low-pass filter means and said analog-to-digital conversion means are combined into a single circuit.

* * * * *